United States Patent
Severn

(10) Patent No.: US 6,407,438 B1
(45) Date of Patent: Jun. 18, 2002

(54) SEMICONDUCTOR OPTO-ELECTRONIC DEVICE PACKAGING

(75) Inventor: John Kenneth Severn, Totnes (GB)

(73) Assignee: Northern Telecom Limited, Montreal (CA)

( * ) Notice: Subject to any disclaimer, the term of this patent is extended or adjusted under 35 U.S.C. 154(b) by 0 days.

(21) Appl. No.: 09/070,899

(22) Filed: Apr. 30, 1998

(30) Foreign Application Priority Data

Jan. 30, 1998 (GB) .............................. 9802105

(51) Int. Cl.⁷ .............................................. H01L 23/06
(52) U.S. Cl. ........................................ 257/433; 257/778
(58) Field of Search .............................. 438/64; 257/433, 257/778, 698, 684, 704

(56) References Cited

U.S. PATENT DOCUMENTS

| | | | | |
|---|---|---|---|---|
| 5,041,900 A | * | 8/1991 | Chen et al. ...................... | 357/73 |
| 5,600,130 A | * | 2/1997 | VanZeghbroeck ........ | 250/214.1 |
| 5,719,414 A | * | 2/1998 | Sato et al. ................... | 257/186 |
| 5,798,566 A | * | 8/1998 | Sato et al. ................... | 257/712 |
| 5,881,945 A | * | 3/1999 | Edwards et al. ......... | 228/124.6 |

FOREIGN PATENT DOCUMENTS

| | | | |
|---|---|---|---|
| EP | 0604405 A1 | 6/1994 | ............. G01J/5/20 |
| GB | 2 064 862 A | 6/1979 | |
| GB | 2 208 944 A | 8/1987 | |

OTHER PUBLICATIONS

Cockayne, "Materials spects Of Indium Phosphide", North–Holland Publishing, Amsterdam, pp. 90–95, 1983.

* cited by examiner

Primary Examiner—Douglas A. Wille
(74) Attorney, Agent, or Firm—Lee, Mann, Smith, McWilliams, Sweeney & Ohlson

(57) ABSTRACT

A rear light entry photodetector array chip is secured face-down with solder on to the front face of a ceramic submount provided with electrically conductive vias. A frame-shaped mass of solder seals the chip to the submount to provide a hermetic enclosure protecting sensitive semiconductor surface areas of the photodetector chip array where electric fields are liable to be present in the vicinity of a pn or metal/semiconductor junction. The place of the photodetector array can be taken by a similar construction array of semiconductor light-emissive opto-electronic devices, such as VCSELs, or a mixed array including emitters and detectors.

3 Claims, 3 Drawing Sheets

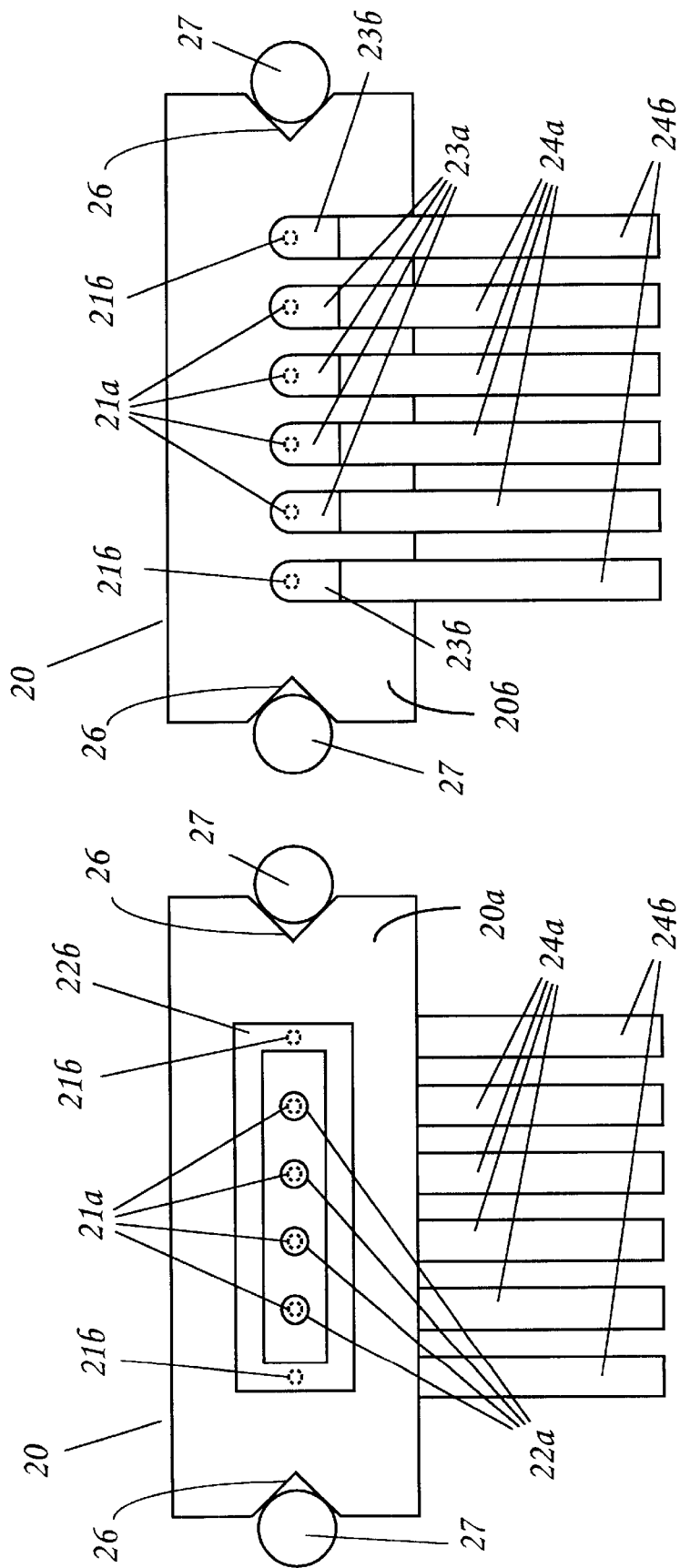

SEMICONDUCTOR OPTO-ELECTRONIC DEVICE PACKAGING

Background to the Invention

It is known that, if exposed to an undesirable environment, the performance of a semiconductor opto-electronic device, such as a light-emissive diode, laser or photodetector can become degraded. Such degradation can occur even though sensitive surface areas of the device, particularly where an electric field is present during operation of the device in the vicinity of a p-n junction or a junction between semiconductor material and metal, are protected from the ambient by a deposited dielectric layer. For this reason a number of applications for semiconductor opto-electronic devices have required such devices to be hermetically packaged in order to reduce the risk of occurrence of this kind of performance degradation. The packaging must include provision, both for electrical connections with the device from outside the package, and for the feeding into the package, or out of it, of the optical signal that the device is designed to detect or produce. One way of effecting such provision is to provide a window in the package wall as for instance described in GB 2 208 944A in relation to a photodetector. If the photodetector is to receive light emitted from the end of an optical fibre, the construction of the package may be such as to make the minimum separation between the end of the fibre and the photodetector so great as to require some form of lens coupling between them. This may be provided by a lens within the package, by a lens outside the package, or by using a lens as part of the package window, as described in GB 2 208 944A. As an alternative to the use of a window, a wall of the package may be penetrated in a hermetically sealed manner by some form of light guide, as for instance described in GB 2 064 862A. In the case of the particular structure described in GB 2 064 862A, the outer end of the light guide is butted against the optical fibre, but a clearly valid alternative is to replace the light guide with an optical fibre having properties similar to, or identical with, those of the optical fibre whose output it is desired shall be detected by the photodetector.

The use of the optical fibre/guide hermetic feedthrough, by definition requires an hermetic seal around the optical fibre/guide, which is typically expensive to manufacture and difficult to test for leaks because the fibre is usually provided outside the enclosure with mechanical protection in the form of a plastics protective coating. The use of a window in place of the hermetic fibre-guide feedthrough avoids these particular problems, albeit at the expense of adding significantly to the complexity and expense of the provision of a mechanical link between the photodetector chip and the optical fibre whose output is to be detected by the chip.

SUMMARY OF THE INVENTION

The present invention is concerned with the provision of an alternative form of hermetic enclosure which does not involve any requirement for an optical fibre/guide hermetic feedthrough, and which affords the possibility of a relatively simple and cheap form of establishing mechanical coupling of the end of an optical fibre array so as direct light emitted therefrom on to the photosensitive areas of the photodetector.

The invention is not limited in its applicability solely to hermetically packaged photodetector arrays, but is applicable also to semiconductor opto-electronic device arrays that include of consist of elements that emit light, such as LEDs and VCSELs.

According to the present invention there is provided an opto-electronic device array assembly including a semiconductor chip having a monolithic array of planar construction semiconductor opto-electronic rear light entry/exit devices, which chip is bonded face down upon a ceramic substrate so as to constitute an hermetic enclosure with opposed walls constituted respectively by the chip and the ceramic substrate.

BRIEF DESCRIPTION OF THE DRAWINGS

There follows a description of opto-electronic device assemblies embodying the present invention in preferred form. The description refers to the accompanying drawings in which:

FIGS. 2 and 3 are schematic front and rear views of the photodetector submount.

DETAILED DESCRIPTION OF PREFERRED EMBODIMENTS

Figure 1:
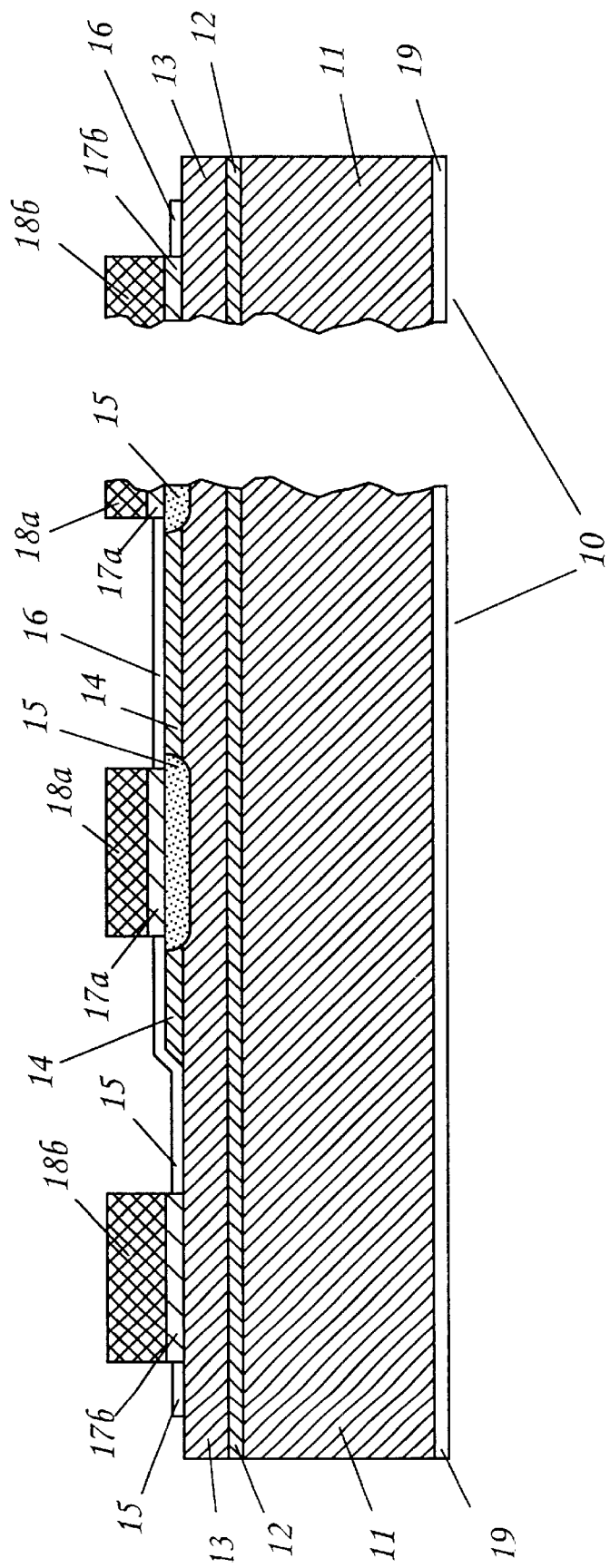
FIG. 1 is a schematic cross-section of the photodetector area of the photodetector.

Referring to FIG. 1, the basic structure of a rear light-entry planar semiconductor photodiode array chip 10 depicted in FIG. 1 is created on a tin-doped InP substrate 11. On the substrate are epitaxially grown an n-type InP buffer layer 12, an intrinsic InGaAs absorption layer 13, and an n-type InP layer of capping material 14. The capping layer is masked, and portions 15 of it, and of the underlying absorption layer 13, are converted into p-type material by the diffusion of zinc from a source of ZnAs. Except for small regions of the remaining n-type capping material that surround the p-type region of portion 15, the rest of the capping layer material is removed. A layer 16 of silicon oxynitride is deposited to augment silicon oxynitride regions left by previous processing, and this (composite) layer 16 is patterned to define contact areas prior to the sputtering of platinum/gold contact metal which is patterned to define a set of p-type central contacts 17a contacting the p-type material and, encircling that set of contacts 17a, a rectangular frame-shaped outer n-type contact 17b contacting the n-type material of the absorption layer 13. The set of contacts 17a and the contact 7b are coated respectively with preforms 18a and 18b of 80:20 gold tin solder conforming in shape with their underlying contacts 17a and 17b. This solder is conveniently deposited using an e-beam evaporator and lift-off photolithography. Optionally, the rear face of the substrate 11 is provided with an antireflection coating 19 which may also provide a degree of mechanical protection for the underlying semiconductor substrate.

The front and rear faces of a ceramic submount for the photodiode of FIG. 1 are depicted respectively in FIGS. 2 and 3. The submount, which is indicated generally at 20, is a ceramic submount of a type which has electrically conductive metallic-filled vias 21a and 21b extending through the thickness of the submount from the front surface 20a to the rear 20b. Such vias are created by filling through-holes in the submount, while it is still green (un-fired), with a metal loaded paste of a refractory metal such as tungsten and then firing the submount. Ceramic submounts of this type are known for example from EP 0 547 807, and can for instance be purchased from Sumitomo Metal Ceramics Inc. or NTK, Technical Ceramics Division of NGK Spark Plug Company Ltd The fully fired submount is provided, on its front face 20a, with areas 22a and 22b of metallisation. These areas of metallisation cover the respective vias 21a and 21b, and have configurations corresponding to those of the p-type and n-type contacts 17a and 17b of the photodiode respectively. The rear face 20b of the submount 20 is provided with areas 23a and 23b of metallisation respectively contacting vias 21a and 21b, to which areas terminal tags 24a and 24b are secured with braze metal (not shown).

The photodiode array chip is applied to the submount with a tack bond which is effected at a temperature at which the solder is hot enough to be tacky rather than fully molten. The assembly is placed in a chamber (not shown) in order to remove any moisture from the space contained between the photodiode chip and submount that is encircled by the frame-shaped solder preform 18b. To this end, this space may be first evacuated, and then back-filled with an inert gas such as dry nitrogen or argon. The flushing of moisture from the space may be facilitated by arranging for there to be a vent provided by a break (not shown) in the frame of the solder preform 18b. After the residual moisture has been flushed from the space, the solder is heated to a higher temperature sufficient to cause it to become fully molten at which stage the vent is closed by capillary flow. In this way a hermetically sealed enclosure is formed containing the regions of the photodiodes particularly sensitive to degradation, namely the surface area of semiconductive material where an electric field may be present during operation of the photodetector in the vicinity of its p-n junction or a semiconductor/metal junction.

In the foregoing specific description the frame-shaped solder preform 18b performs (after it has been flowed) the dual function of seal for the hermetic enclosure, and of providing electrical connection between the n-type contact of the photodiode chip and metallisation on the submount. In an alternative configuration, not shown, these functions are separated so that the frame-shaped solder preform that performs the sealing function (after it has been flowed) encircles both the electrical connection with the p-type contacts, and that made with the n-type contact. In either instance the frame-shaped solder preform that performs the sealing function is not necessarily rectangular, but may for instance have a pair of straight sides joined by rounded ends. Another variant involves applying the solder preforms to the submount rather than to the photodiode array chip. Such solder can, in this instance, conveniently be applied by screen printing.

Typically, the individual photodiodes of the array are optically coupled with the ends of individual optical fibres. Such fibres may be constituted by a fibre ribbon terminating in a connector element that is releasably coupled with the photodetector array. In such a connector element the fibre ends are located in known positions relative to one or more reference surfaces of that connector element and hence, for efficient optical coupling, the individual photodiodes of the array need to be similarly located in corresponding known positions relative to those reference surfaces. To this end, the chip 10 may be mounted in known position relative to the ceramic submount 20, and this submount provided with one or more reference surfaces that are alignable with their counterparts in the fibre ribbon termination connector element.

The ceramic submount depicted in FIGS. 2 and 3 is one designed for incorporation as part of a connector element for mating with an MT-type fibre ribbon connector element. To this end, the submount is provided with a pair of V-grooves 26 that constitute reference surfaces for receiving a corresponding pair of MT-connector type guide pins 27. (Typically these pins are 0.7 mm diameter pins at 4.6 mm centres.) Chip alignment with respect to these reference surfaces 26 is conveniently achieved optically by locating the chip 10 in a predetermined position as indicated by the positioning of its contacts 17a and 17b, by locating the submount 20 in a predetermined position as indicated by the positioning of its reference surface V-grooves (or its guide pins 27), and then, while this relative positioning is maintained, tacking the chip 10 to the submount 20 in the manner described above.

Figure 4:
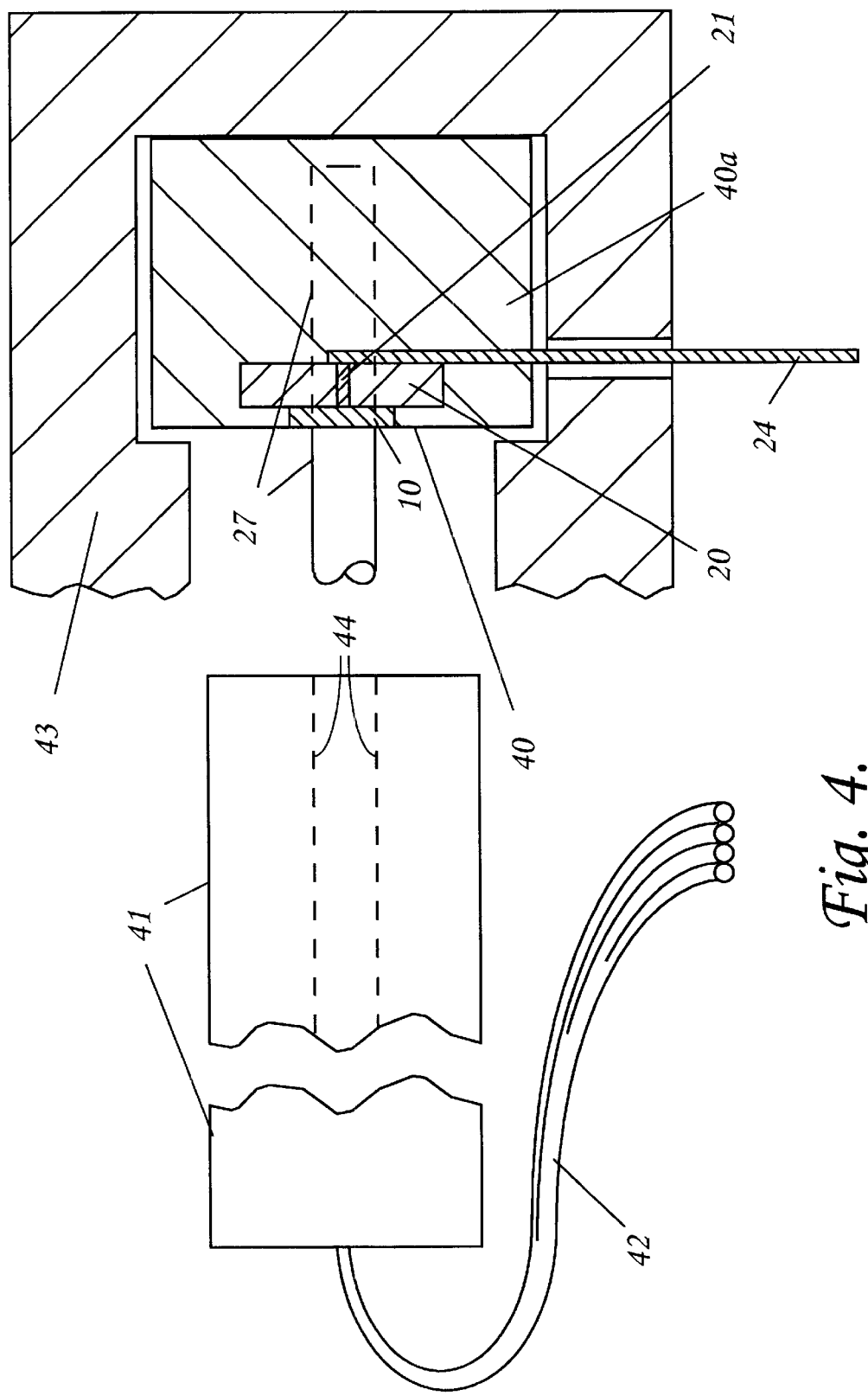
FIG. 4 is a schematic part-sectioned view of two mateable MT-type connector elements, one terminating a fibre ribbon, and the other including an opto-electronic array device mounted on the chip submount of FIGS. 2 and 3.

Referring to FIG. 4, to form an MT-type connector element 40 suitable for mating with a further MT-type connector element 41 that terminates a fibre ribbon 42, the assembly comprising the chip 10, its ceramic submount 20, guide pins 27 and terminal tags 24 is potted in resin 40a. FIG. 4 shows the resin having a surface flush with the surface of the chip 10, in which case connector element 41 will come into direct contact with that surface of the chip. If the chip requires additional mechanical protection over and above that provided by its antireflection coating 19, this may be provided by altering the configuration of the encapsulation 40a to include a layer (not shown) to cover the chip surface. Since this layer needs to possess optical properties not required of the rest of the encapsulation, the encapsulation may in this instance be formed in two parts of different composition.

The connector element 40 is held moveably captive in a shell 43, while the fibre termination element is similarly held in another shell (not shown). Both shells are provided with releasable retention means (not shown) for releasably engaging a union member (not shown). Initial engagement of the shells into opposite end of the union member brings the two connector elements 40 and 41 into approximate alignment before more precise alignment is achieved by means of the entry of the guide pins 27 into corresponding guide apertures 44 formed in connector element 41. Resilient means (not shown) acting between the two connector shells and their respective connector elements 40 and 41 ensure that when both shells are fully engaged in the union member the forward ends of the two connector elements are held together under compression.

Instead of having the guide pins 27 secured to in the connector element 40 for sliding into the receiving guide holes formed in the fibre ribbon termination connector element 41, the pins may alternatively be secured in the fibre ribbon termination connector element 41, and be received as a sliding fit in guide holes formed in connector element 40. A further possibility is to dispense entirely with the V-grooves 26, and instead mount the guide pins 27 in position in the ceramic submount 20 while it is still in its green state.

The foregoing specific description has related to the mounting of a planar construction photodiode array chip 10 upon a ceramic submount 20 in a hermetic manner. It will be evident however that the place of the specific planar construction photodiode array chip can be taken by an alternative form of planar opto-electronic chip having the same of similar arrangement of contacts. Such an array is not necessarily a photodetector array, but may alternatively be an array of rear facet emitting Light Emitting Diodes (LEDs) or Vertical Cavity Surface-Emitting Lasers (VCSELs). An example of the sort of VCSEL array that can be employed is a modification of the array described in the paper by Y Ohiso et al entitled, 'Flip-chip bonded 0.85 $\mu$m Vertical-cavity Surface-emitting Laser Array using an AlGaAs substrate' presented at the Topical meeting, Integrated Photonics Research. 1996, Technical Digest series. Vol. 6 pp. 482–5. A further alternative is to have a planar opto-electronic array that contains one or more photodetectors monolithically integrated with one or more light emitters.

The ceramic submount 20 of FIGS. 2, 3 and 4 is one provided with vias 21 extending through the whole thickness of the submount from face 20a to face 20b, by means of which vias electrical connection is made with the chip 10. An alternative way of providing such connection is to deposit and pattern a multilayer metal and insulator structure (not shown) on the face 20a, by means of which such electrical connection is provided by conductive tracks that thread the hermetic enclosure all on the one face, face 20a, of the submount. Particularly for high speed applications, this will not generally be the preferred option because undesirable capacitance effects are liable to be significantly greater than with the option that employs the vias 21 that extend through the submount from one face to the other.

What is claimed is:

1. An opto-electronic device array assembly including a semiconductor chip having a monolithic array of planar construction semiconductor opto-electronic rear light entry/exit devices, which chip is bonded with solder face down upon a ceramic substrate so as to constitute an hermetic enclosure with opposed walls constituted respectively by the chip and the ceramic substrate, and wherein electrical contact with each opto-electronic device of the array is made by way of electrically conductive connections at least one of which includes an electrically conductive via extending through the thickness of the ceramic substrate.

2. An assembly as claimed in claim 1, wherein the array of planar construction devices is provided with a set of contacts of one conductivity type, which set is encircled by a contact of the other conductivity type, and wherein the encircling contact is bonded with solder to the ceramic substrate in such a way that this bond co-operates with the chip and the ceramic substrate to form the hermetic enclosure.

3. An assembly as claimed in claim 1 wherein the array of planar construction devices is provided with sets of n-type and p-type contacts, both sets of contacts being encircled by a frame-shaped region of solder wettable material which is bonded with solder to the ceramic substrate in such a way that this bond co-operates with its chip and the ceramic substrate to form the hermetic enclosure.

* * * * *

UNITED STATES PATENT AND TRADEMARK OFFICE
CERTIFICATE OF CORRECTION

PATENT NO. : 6,407,438 B1  Page 1 of 1
APPLICATION NO. : 09/070899
DATED : June 18, 2002
INVENTOR(S) : Severn It is certified that error appears in the above-identified patent and that said Letters Patent is hereby corrected as shown below:

On the title page,
Item [*] delete "0" and insert --261--.

Signed and Sealed this

Twenty-seventh Day of February, 2007

JON W. DUDAS
*Director of the United States Patent and Trademark Office*